(12) United States Patent
Oh

(10) Patent No.: US 12,727,480 B2
(45) Date of Patent: Sep. 1, 2026

(54) SEMICONDUCTOR PACKAGE HAVING ChIP ON FIRST INSULATING LAYER WITH HIGHER COEFFICIENT OF THERMAL EXPANSION AND LOWER TENSILE STRENGTH THAN ADJACENT SECOND INSULATING LAYER

(71) Applicant: SAMSUNG ELECTRONICS CO., LTD., Suwon-si (KR)

(72) Inventor: Jooyoung Oh, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 419 days.

(21) Appl. No.: 18/309,179

(22) Filed: Apr. 28, 2023

(65) Prior Publication Data

US 2024/0063144 A1 Feb. 22, 2024

(30) Foreign Application Priority Data

Aug. 22, 2022 (KR) ........................ 10-2022-0104721

(51) Int. Cl.
*H10W 70/69* (2026.01)
*H10W 42/00* (2026.01)
(Continued)

(52) U.S. Cl.
CPC ....... *H10W 42/121* (2026.01); *H10W 70/685* (2026.01); *H10W 70/69* (2026.01);
(Continued)

(58) Field of Classification Search
CPC ... H01L 21/56; H01L 21/561; H01L 21/6835; H01L 2221/68359; H01L 2224/16227;
(Continued)

(56) References Cited

U.S. PATENT DOCUMENTS 6,239,703 B1 * 5/2001 Friedman et al. ......... 340/572.7
7,790,270 B2 9/2010 Tomita et al.
(Continued)

FOREIGN PATENT DOCUMENTS

| | | | |
|---|---|---|---|
| JP | 3370498 | B2 | 1/2003 |
| JP | 3841135 | B2 | 8/2006 |
| KR | 10-2022-0037069 | A | 3/2022 |

*Primary Examiner* — Wael M Fahmy
*Assistant Examiner* — Alice W Tang
(74) *Attorney, Agent, or Firm* — Wolf, Greenfield & Sacks, P.C.

(57) ABSTRACT

A semiconductor package includes a substrate having a lower surface and an opposite upper surface, an insulating layer, and a wiring layer on the insulating layer. A first upper protective layer is on the upper surface and includes first openings. A second upper protective layer is on the first upper protective layer. A semiconductor chip is on the first upper protective layer and includes connection pads electrically connected to the wiring layer through the first openings. An encapsulant seals at least a portion of the semiconductor chip, and the second upper protective layer. The first upper protective layer includes a first insulating material. The second upper protective layer includes a second insulating material having a coefficient of thermal expansion lower than that of the first insulating material and a tensile strength higher than that of the first insulating material.

18 Claims, 8 Drawing Sheets

(51) Int. Cl.

| | |
|---|---|
| ***H10W 70/60*** | (2026.01) |
| ***H10W 70/685*** | (2026.01) |
| ***H10W 72/20*** | (2026.01) |
| ***H10W 72/30*** | (2026.01) |
| ***H10W 72/50*** | (2026.01) |
| ***H10W 72/90*** | (2026.01) |
| ***H10W 74/10*** | (2026.01) |
| ***H10W 74/40*** | (2026.01) |
| ***H10W 76/40*** | (2026.01) |
| ***H10W 90/00*** | (2026.01) |
| *H10W 70/65* | (2026.01) |
| *H10W 72/00* | (2026.01) |
| *H10W 74/01* | (2026.01) |
| *H10W 99/00* | (2026.01) |

(52) U.S. Cl.

CPC .......... *H10W 74/117* (2026.01); *H10W 90/00* (2026.01); *H10W 90/701* (2026.01); *H10W 72/884* (2026.01); *H10W 90/724* (2026.01); *H10W 90/734* (2026.01); *H10W 90/754* (2026.01)

(58) Field of Classification Search

CPC . H01L 2224/32225; H01L 2224/48227; H01L 2224/73265; H01L 23/12; H01L 23/16; H01L 23/29; H01L 23/3128; H01L 23/49811; H01L 23/49816; H01L 23/49822; H01L 23/49827; H01L 23/49838; H01L 23/49894; H01L 23/562; H01L 24/07; H01L 24/13; H01L 24/16; H01L 24/32; H01L 24/47; H01L 24/48; H01L 24/73; H01L 24/83; H01L 24/92; H01L 25/0657; H01L 25/0655

See application file for complete search history.

(56) References Cited

U.S. PATENT DOCUMENTS

| | | | | |
|---|---|---|---|---|
| 7,816,783 | B2 | 10/2010 | Kawabata | |
| 7,964,289 | B2 * | 6/2011 | Takai et al. | 428/612 |
| 8,866,310 | B2 * | 10/2014 | Kim et al. | 257/777 |
| 9,087,847 | B2 | 7/2015 | Lin et al. | |
| 10,535,615 | B2 | 1/2020 | Dubey et al. | |
| 10,685,922 | B2 * | 6/2020 | Lin et al. | H01L 23/562 |
| 2009/0289338 | A1 * | 11/2009 | Hu et al. | 257/678 |
| 2012/0152598 | A1 * | 6/2012 | Yamada et al. | 174/257 |
| 2013/0119540 | A1 | 5/2013 | Hong et al. | |
| 2014/0204546 | A1 * | 7/2014 | Baker | 361/760 |
| 2014/0252634 | A1 * | 9/2014 | Hung | 257/773 |
| 2018/0082933 | A1 * | 3/2018 | Ko et al. | H01L 25/105 |
| 2018/0204807 | A1 * | 7/2018 | Aizawa | H01L 23/562 |

* cited by examiner

SEMICONDUCTOR PACKAGE HAVING ChIP ON FIRST INSULATING LAYER WITH HIGHER COEFFICIENT OF THERMAL EXPANSION AND LOWER TENSILE STRENGTH THAN ADJACENT SECOND INSULATING LAYER

CROSS-REFERENCE TO RELATED APPLICATION(S)

This application claims priority under 35 U.S.C. § 119 to Korean Patent Application No. 10-2022-0104721 filed on Aug. 22, 2022 in the Korean Intellectual Property Office, the disclosure of which is incorporated herein by reference in its entirety.

BACKGROUND

The present disclosure relates to semiconductor packages.

Semiconductor packages may include different types of materials such as metals, polymers, and semiconductor materials. A difference in coefficients of thermal expansion between the different types of materials may cause warpage of semiconductor packages.

SUMMARY

An aspect of the present disclosure provides semiconductor packages having improved warpage properties.

According to an aspect of the present disclosure, there is provided a semiconductor package including a substrate having a lower surface and an opposite upper surface, an insulating layer, and a wiring layer on the insulating layer. A first upper protective layer is on the upper surface of the substrate, the first upper protective layer having first openings exposing at least a portion of the wiring layer. A second upper protective layer is on the first upper protective layer. At least one semiconductor chip is on the first upper protective layer. The second upper protective layer extends around, and is spaced apart from, an outer periphery of the at least one semiconductor chip. The at least one semiconductor chip includes connection pads electrically connected to the wiring layer through the first openings. An encapsulant is on at least a portion of each of the at least one semiconductor chip and the second upper protective layer. Connection bumps are on the lower surface of the substrate and are electrically connected to the wiring layer. The first upper protective layer may include a first insulating material. The second upper protective layer may include a second insulating material having a coefficient of thermal expansion (CTE) lower than a CTE of the first insulating material and a tensile strength higher than a tensile strength of the first insulating material.

According to another aspect of the present disclosure, there is provided a semiconductor package including a substrate having a lower surface, an opposite upper surface, an insulating layer, and a wiring layer on the insulating layer. A first upper protective layer is on the upper surface of the substrate and covers at least a portion of the wiring layer. A second upper protective layer is on the first upper protective layer. An outer surface of the second upper protective layer is spaced apart from an edge of the substrate. At least one semiconductor chip is on the first upper protective layer and spaced apart from the second upper protective layer. The at least one semiconductor chip is electrically connected to the wiring layer. An encapsulant is in a space between the edge of the substrate and the second upper protective layer and in a space between the at least one semiconductor chip and the second upper protective layer.

According to another aspect of the present disclosure, there is provided a semiconductor package including a substrate having a wiring layer. A first upper protective layer is on the substrate and covers at least a portion of the wiring layer. The first upper protective layer has a first outer surface that is coplanar with an edge of the substrate. A second upper protective layer is on the first upper protective layer and is adjacent to at least a portion of the edge of the substrate. The second upper protective layer has a second outer surface that is not coplanar with the edge of the substrate. A lower protective layer is below the substrate and covers at least a portion of the wiring layer. At least one semiconductor chip is on the first upper protective layer and is spaced apart from the second upper protective layer. The at least one semiconductor chip is electrically connected to the wiring layer.

According to example embodiments of the present disclosure, a protective layer may be formed on a substrate using different types of insulating materials, thereby providing a semiconductor package having improved warpage properties.

BRIEF DESCRIPTION OF DRAWINGS

The above and other aspects, features, and advantages of the present inventive concept will be more clearly understood from the following detailed description, taken in conjunction with the accompanying drawings, in which.

DETAILED DESCRIPTION

Hereinafter, preferred example embodiments of the present disclosure will be described with reference to the accompanying drawings.

Figure 1A:
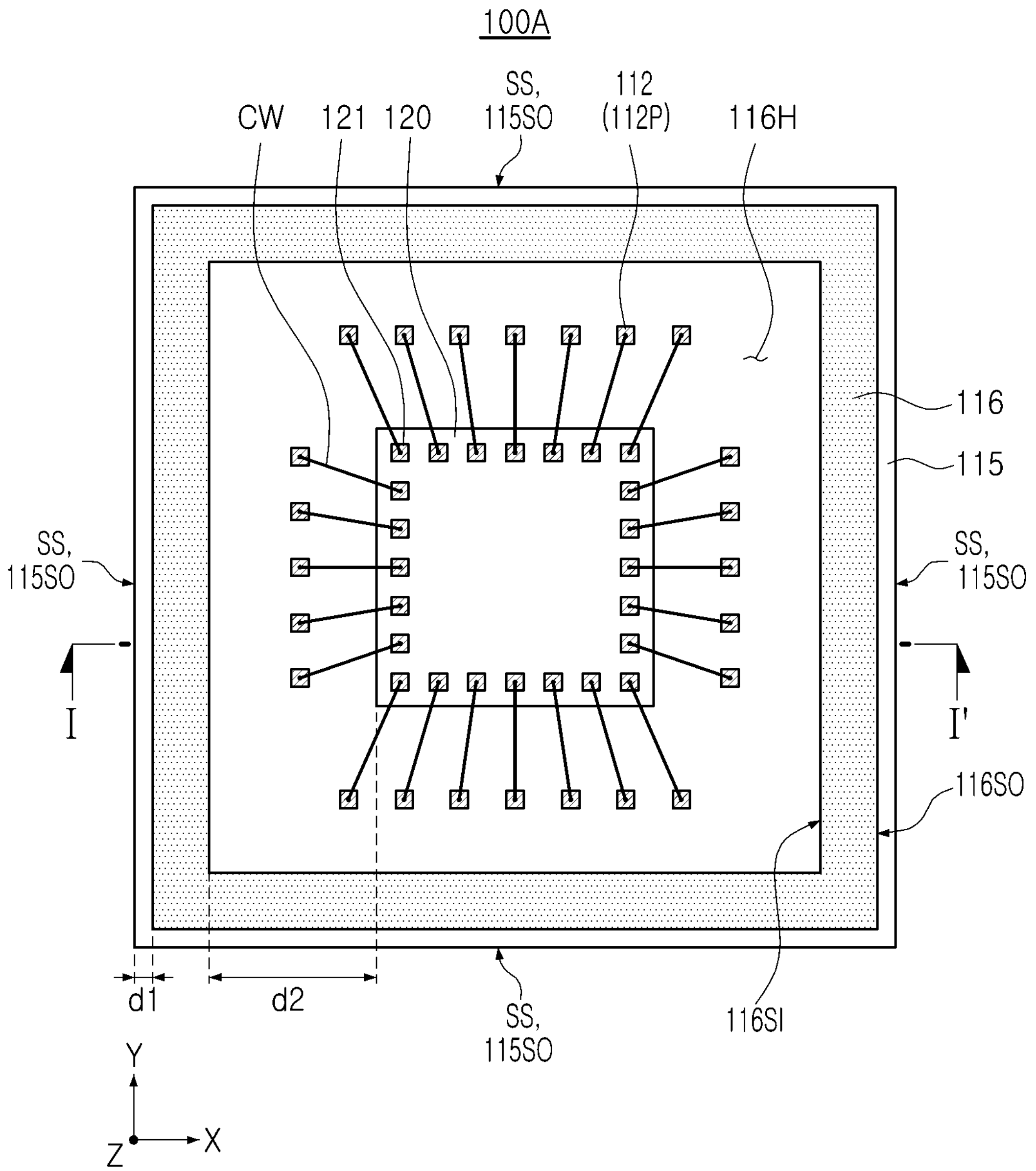
FIG. 1A is a plan view illustrating a semiconductor package according to an example embodiment of the present disclosure.
Figure 1B:
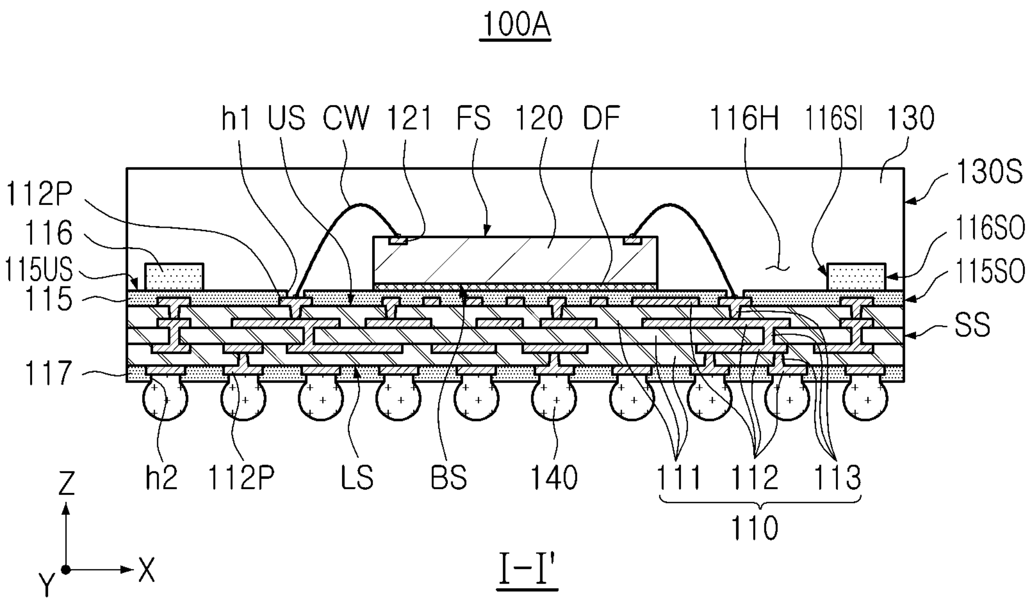
FIG. 1B is a cross-sectional view taken along line I-I' of FIG. 1A.

FIG. 1A is a plan view illustrating a semiconductor package 100A according to an example embodiment of the present disclosure, and FIG. 1B is a cross-sectional view taken along line I-I' of FIG. 1A. For ease of description, in FIG. 1A, the encapsulant 130 of FIG. 1B is omitted.

Referring to FIGS. 1A and 1B, a semiconductor package 100A according to an example embodiment may include a substrate 110, a first upper protective layer 115, a second upper protective layer 116, and at least one semiconductor chip 120. According to an example embodiment, the semiconductor package 100A may further include an encapsulant 130 and connection bumps 140. According to the present disclosure, the second upper protective layer 116 having physical properties different from those of the first upper protective layer 115 may be disposed to be adjacent to an edge SS of the substrate 110, thereby improving warpage properties of the substrate 110 and improving reliability and yield of the semiconductor package 100A. In an example embodiment, the second upper protective layer 116 may have a coefficient of thermal expansion (CTE) lower than that of the first upper protective layer 115, and may have tensile strength higher than that of the first upper protective layer 115.

The substrate 110, a support substrate on which the semiconductor chip 120 is mounted, may be a package substrate with rewiring connection pads 121 of the semiconductor chip 120. The package substrate may include a printed circuit board (PCB), a ceramic substrate, a glass substrate, a tape wiring board, and the like. For example, the substrate 110 may have a lower surface LS and an opposite upper surface US, and may include an insulating layer 111, a wiring layer 112, and a wiring via 113.

The insulating layer 111 may include an insulating material. For example, the insulating material may include a thermosetting resin such as an epoxy resin, a thermoplastic resin such as polyimide, or a resin in which an inorganic filler and/or a glass fiber (or glass cloth or glass fabric) is impregnated in the thermosetting resin or the thermoplastic resin, such as, a prepreg, Ajinomoto build-up film (ABF), FR-4, bismaleimide triazine (BT), or a photo-imageable dielectric (PID). For example, the insulating layer 111 may include a non-photosensitive resin such as a prepreg or ABF, or a photosensitive resin such as a PID.

The insulating layer 111 may include a plurality of insulating layers 111 stacked in a vertical direction (Z-axis direction). Among the plurality of insulating layers 111, an uppermost insulating layer 111 may provide the upper surface US of the substrate 110, and a lowermost insulating layer 111 may provide the lower surface LS. A boundary between the plurality of insulating layers 111 may be unclear depending on a process. In some example embodiments, the insulating layers 111 more or fewer than those illustrated in the drawings may be formed. When the substrate 110 is a PCB, a core layer positioned in the middle of the plurality of insulating layers 111 may be thicker than the insulating layers 111 stacked on upper and lower portions thereof. The core layer may be formed using, for example, a copper clad laminate (CCL), an unclad CCL, a glass substrate, a ceramic substrate, or the like. However, the present disclosure is not limited thereto, and the substrate 110 may be a PCB not including a core layer.

The wiring layer 112 may include, for example, a metal material including copper (Cu), aluminum (Al), silver (Ag), tin (Sn), gold (Au), nickel (Ni), lead (Pb), titanium (Ti), or alloys thereof. The wiring layer 112 may include, for example, a ground (GND) pattern, a power (PWR) pattern, and a signal (S) pattern. The signal (S) pattern may provide a path through which various signals except for the ground (GND) pattern and the power (PWR) pattern, for example, a data signal, are transmitted and received.

The wiring layer 112 may be provided as a plurality of wiring layers 112 respectively disposed on the plurality of insulating layers 111. The plurality of wiring layers 112 may be electrically connected to each other through the wiring via 113. The number of layers of the wiring layer 112 may be determined depending on the number of layers of the insulating layer 111, and may include layers more or fewer than those illustrated in the drawings. Lowermost and uppermost wiring layers 112 among the plurality of wiring layers 112 may include pads 112P on which the semiconductor chip 120 and the connection bumps 140 are mounted. The pads 112P may be formed to have different sizes and/or pitches depending on a target to be mounted. For example, the pads 112P disposed on the lower surface LS of the wiring layer 112 may have a size and/or pitch larger than those of the pads 112P disposed on the upper surface US of the wiring layer 112.

The wiring via 113 may be electrically connected to the wiring layer 112, and may include a signal via, a ground via, and a power via. The wiring via 113 may include a metal material, for example, copper (Cu), aluminum (Al), silver (Ag), tin (Sn), gold (Au), nickel (Ni), lead (Pb), titanium (Ti), or alloys thereof. The wiring via 113 may have a filled via in which a metal material is filled or a conformal via in which a metal material is formed along an inner wall of a via hole. The wiring via 113 may be integrated with the wiring layer 112, but example embodiments of the present disclosure are not limited thereto.

The first upper protective layer 115 may be disposed on the upper surface US of the substrate 110 to cover at least a portion of the wiring layer 112, and first openings h1 exposing at least a portion of the wiring layer 112. The first upper protective layer 115 may be a solder resist layer protecting the wiring layer 112 from external physical/chemical damage. The solder resist layer may include an insulating material, and may be formed using, for example, an ABF, FR-4, BT, or a photo solder resist (PSR). According to the present disclosure, the second upper protective layer 116 having different physical properties from those of the first upper protective layer 115 may be introduced, thereby improving warpage properties of the substrate 110.

The second upper protective layer 116 may be disposed on the first upper protective layer 115 to be adjacent to at least a portion of the edge SS of the substrate 110, as illustrated in FIG. 1A. In the same manner as the first upper protective layer 115, the second upper protective layer 116 may include an insulating material such as an ABF, FR-4, BT, or PSR. However, in order to improve warpage properties of the edge SS of the substrate 110, the second upper protective layer 116 may be formed of an insulating material different from those of the insulating layer 111 and the first upper protective layer 115, for example, an insulating material having different physical properties. According to an example embodiment, the first upper protective layer 115 may include a first insulating material, and the second upper protective layer 116 may a second insulating material having a CTE lower than that of the first insulating material and having tensile strength higher than that of the first insulating material.

For example, the CTE of the second upper protective layer 116 (or "second insulating material") may be 0.5 times or less of the CTE of the first upper protective layer 115 (or "first insulating material"). The CTE of the first insulating material may be in a range of about 50 ppm/° C. (parts per million per degree Celsius) to about 70 ppm/° C., and the CTE of the second insulating material may be in a range of about 5 ppm/° C. to about 25 ppm/° C. However, a difference in CTE between the second insulating material and the first insulating material is not limited to the above-described numerical range.

For example, the tensile strength of the second upper protective layer 116 (or "second insulating material") may be 1.5 times or more of the tensile strength of the first upper protective layer 115 (or "first insulating material"). The tensile strength of the first insulating material may be about 40 Mpa (megapascals) to about 60 Mpa, and the tensile strength of the second insulating material may be about 90 Mpa to about 110 Mpa. However, a difference in tensile strength between the second insulating material and the first insulating material is not limited to the above-described numerical range.

The second upper protective layer 116 may be spaced apart from the edge SS of the substrate 110 by a predetermined distance, as illustrated in FIG. 1A. The second upper protective layer 116 may be disposed to be adjacent to the edge SS of the substrate 110 having a relatively large degree of warpage, a separation distance between the edge SS of the substrate 110 and the second upper protective layer 116 may be shorter than a separation distance between the semiconductor chip 120 and the second upper protective layer 116. For example, an outer surface of the second upper protective layer 116 may be spaced apart from the edge SS of the substrate 110 by a first distance d1, and an inner surface of the second protective layer 116 may be spaced apart from an outer surface of the adjacent semiconductor chip 120 by a second distance d2 that is greater than the first distance d1. The first distance d1 may be about 5 μm or more or about 10 μm or more. When the first distance d1 is less than about 5 the second upper protective layer 116 may be exposed to the outside of the encapsulant 130 in a process of cutting the substrate 110, which may cause poor appearance and reduced reliability.

In some example embodiments, the encapsulant 130 may be filled between the edge SS of the substrate 110 and the second upper protective layer 116 and between the at least one semiconductor chip 120 and the second upper protective layer 116. For example, the second upper protective layer 116 may have an outer surface 116SO adjacent to the edge SS of the substrate 110 and an inner surface 116SI opposite to the outer surface 116SO, and the encapsulant 130 may cover the inner surface 116SI and the outer surface 116SO of the second upper protective layer 116. For example, the first upper protective layer 115 may have a first outer surface 115SO coplanar with the edge SS of the substrate 110, and the second upper protective layer 116 may have a second outer surface 116SO having a step difference from the edge SS of the substrate 110 (i.e., the second outer surface 116SO is spaced apart from the edge SS, as illustrated in FIG. 1B).

The second upper protective layer 116 may extend along the edge SS of the substrate 110 to surround at least a portion of a side surface of the at least one semiconductor chip 120. In some example embodiments, the second upper protective layer 116 may continuously or discontinuously surround the semiconductor chip 120. On a plane (X-Y plane), the second upper protective layer 116 may define an inner region 116H in which the semiconductor chip 120 is disposed.

A shape (height, width, planar area, or the like) of the second upper protective layer 116 is not limited to those illustrated in the drawings, and may be modified in various manners depending on warpage properties of the substrate 110. For example, a height of the second upper protective layer 116 may be greater than a thickness of the semiconductor chip 120.

The lower protective layer 117 may be disposed on the lower surface LS of the substrate 110, and may have a second opening h2 exposing at least a portion of the wiring layer 112. The lower protective layer 117 may be a solder resist layer protecting a lowermost wiring layer 112 from external physical/chemical damage to correspond to the first upper protective layer 115. The lower protective layer 117 may include an insulating material similar to that of the first upper protective layer 115. For example, the lower protective layer 117 may include a third insulating material having a CTE higher than that of the second upper protective layer 116 (or "second insulating material") and having tensile strength lower than that of the second upper protective layer 116 (or "second insulating material").

The at least one semiconductor chip 120 (hereinafter, "semiconductor chip") may include the connection pads 121 spaced apart from the second upper protective layer 116, disposed on the first upper protective layer 115, and electrically connected to the wiring layer 112. The semiconductor chip 120 may be disposed on the first upper protective layer 115 (i.e., the second upper protective layer 116 extends around, and is spaced apart from, an outer periphery of the semiconductor chip 120), and may be electrically connected to the wiring layer 112 through the first openings h1 of the first upper protective layer 116. The semiconductor chip 120 may include silicon (Si), germanium (Ge), or gallium arsenide (GaAs), and various types of integrated circuits may be formed therein. An integrated circuit may be a memory chip such as a central processor (for example, CPU), a graphics processor (for example, GPU), a field programmable gate array (FPGA), an application processor (AP), a digital signal processor, a cryptographic processor, a microprocessor, a microcontroller, or the like, but the present disclosure is not limited thereto, and may be a logic chip such as an analog-to-digital converter or an application-specific IC (ASIC), or a memory chip such as a volatile memory (for example, DRAM) or a non-volatile memory (for example, ROM and flash memory). The connection pad 121 may be a pad of a bare chip (for example, an aluminum (Al) pad), but may be a pad of a packaged chip (for example, a copper (Cu) pad) in some example embodiments.

The semiconductor chip 120 may be mounted on the substrate 110 in a wire-bonding manner. For example, the first upper protective layer 115 may have an upper surface 115US in contact with the second upper protective layer 116, and the semiconductor chip 120 may have a rear surface BS facing the upper surface 115US of the first upper protective layer 115, and a front surface FS positioned opposite to the rear surface BS, the front surface on which the connection pads 121 are disposed. At least one adhesive film DF may be disposed between the rear surface BS of the semiconductor chip 120 and the upper surface 115US of the first upper protective layer 115. The connection pads 121 of the semiconductor chip 120 may be connected to the wiring layer 112 through a conductive wire CW. The conductive wire CW may include gold (Au), silver (Ag), lead (Pb), aluminum (Al), copper (Cu), or alloys thereof.

Figure 4:
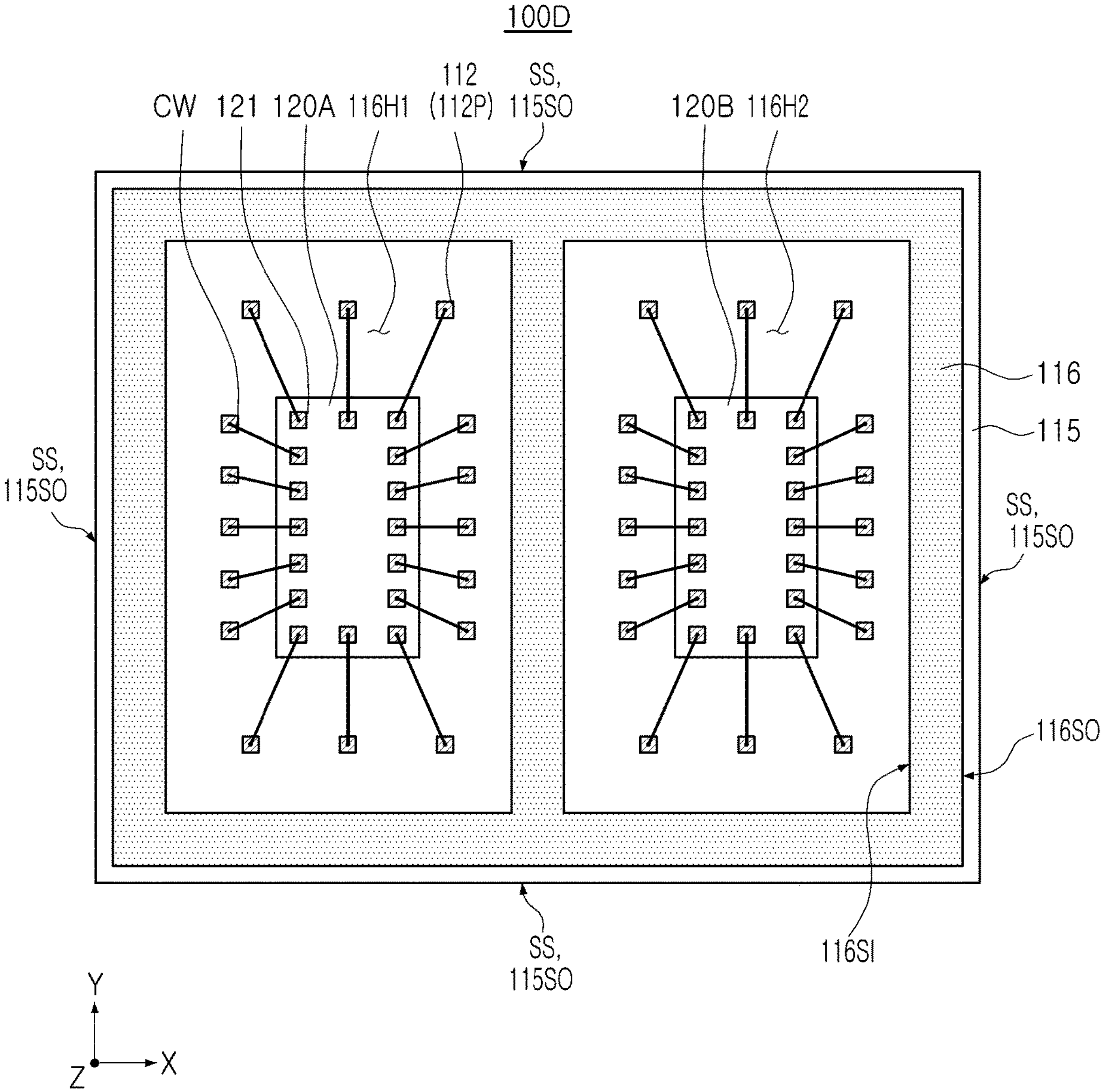
FIG. 4 is a plan view illustrating a semiconductor package according to an example embodiment of the present disclosure.
Figure 5:
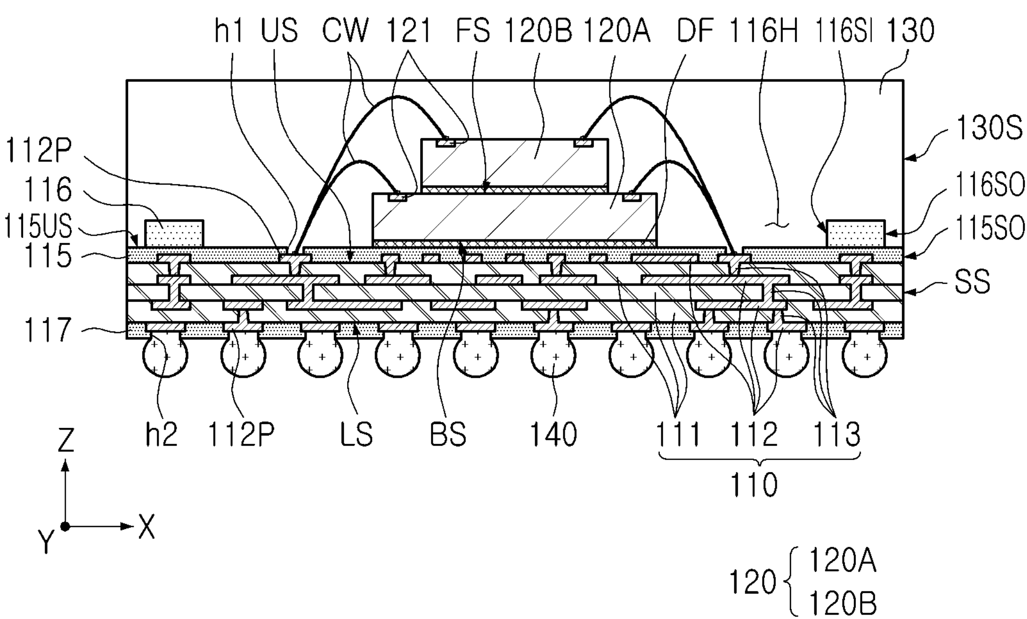
FIG. 5 is a cross-sectional view illustrating a semiconductor package according to an example embodiment of the present disclosure.

In some example embodiments, the semiconductor package 100A may include a plurality of semiconductor chips arranged in a horizontal direction (X-direction or Y-direction) and/or a vertical direction (Z-direction) (see the example embodiments of FIGS. 4 and 5). For example, two or more semiconductor chips arranged in a horizontal direction (X-direction or Y-direction) may be disposed in the inner region 116H of the second upper protective layer 116.

The encapsulant 130 may encapsulate at least a portion of each of the at least one semiconductor chip 120 and the second upper protective layer 116 on the first upper protective layer 115. The encapsulant 130 may include, for example, a prepreg, ABF, FR-4, BT, or epoxy molding compound (EMC) including a thermosetting resin such as an epoxy resin, a thermoplastic resin such as polyimide, or an inorganic filler and/or glass fiber. The second upper protective layer 116 may be spaced apart from the edge SS of the substrate 110 so as to minimize the influence on subsequent processes such as a molding process and a cutting process. Thus, a side surface 130S of the encapsulant 130 may be coplanar with the first outer surface 115SO of the first upper protective layer 115.

The connection bumps 140 may be disposed on the lower surface LS of the substrate 110 and may be electrically connected to the wiring layer 112. The connection bumps 140 may be respectively disposed in the second openings h2 of the lower protective layer 117. The connection bumps 140 may physically and/or electrically connect the semiconductor package 100A to an external device. The connection bumps 140 include a conductive material and may have a ball, pin, or lead shape. For example, the connection bumps 140 may be solder balls.

Figure 2:
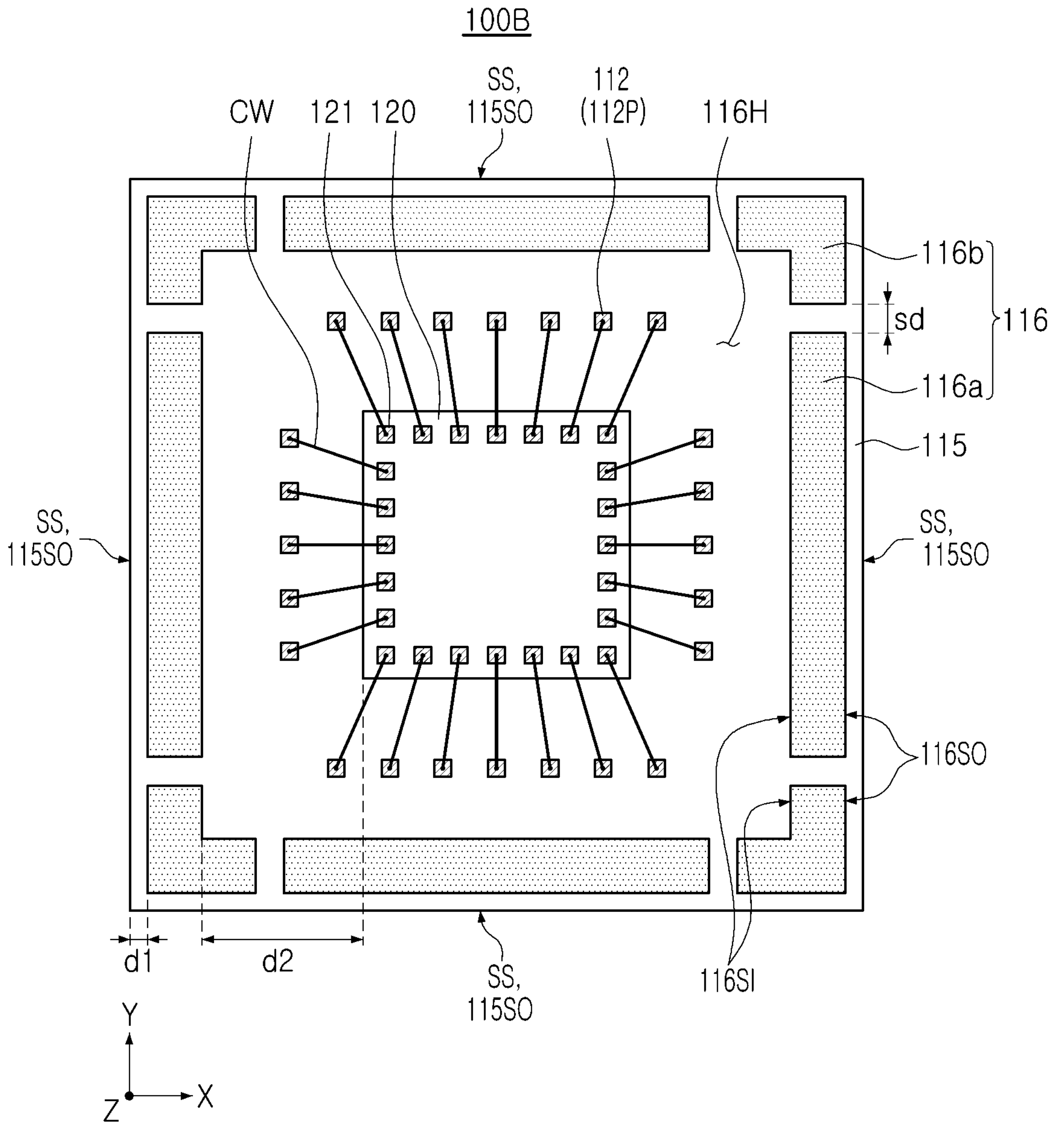
FIG. 2 is a plan view illustrating a semiconductor package according to an example embodiment of the present disclosure.

FIG. 2 is a plan view illustrating a semiconductor package 100B according to an example embodiment of the present disclosure. FIG. 2 illustrates only some components of the semiconductor package 100B corresponding to that illustrated in FIG. 1A.

Referring to FIG. 2, the semiconductor package 100B according to an example embodiment may have features the same as or similar to those described with reference to FIGS. 1A and 1B, except that the second upper protective layer 116 discontinuously extends along the edge SS of the substrate 110. In plan view, the second upper protective layer 116 may include an edge portion 116*a* corresponding to a side of the substrate 110 and a corner portion 116*b* corresponding to a corner of the substrate 110. The edge portion 116*a* and the corner portion 116*b* may be spaced apart from each other. A separation distance sd between the edge portion 116*a* and the corner portion 116*b* is not particularly limited, and may be modified in various manners depending on warpage properties of the substrate 110 and shapes of the edge portion 116*a* and the corner portion 116*b*. In the illustrated embodiment of FIG. 2, the second upper protective layer 116 includes four edge portions 116A, each edge portion 116A adjacent to a respective one of the four sides of the substrate package 100B, and four corner portions 116*b*, each positioned at a respective corner of the substrate package 100B. In some example embodiments, the second upper protective layer 116 may include only one of the edge portion 116*a* and the corner portion 116*b*, or may include the edge portion 116*a* and corner portion 116*b* having an irregular shape.

Figure 3:
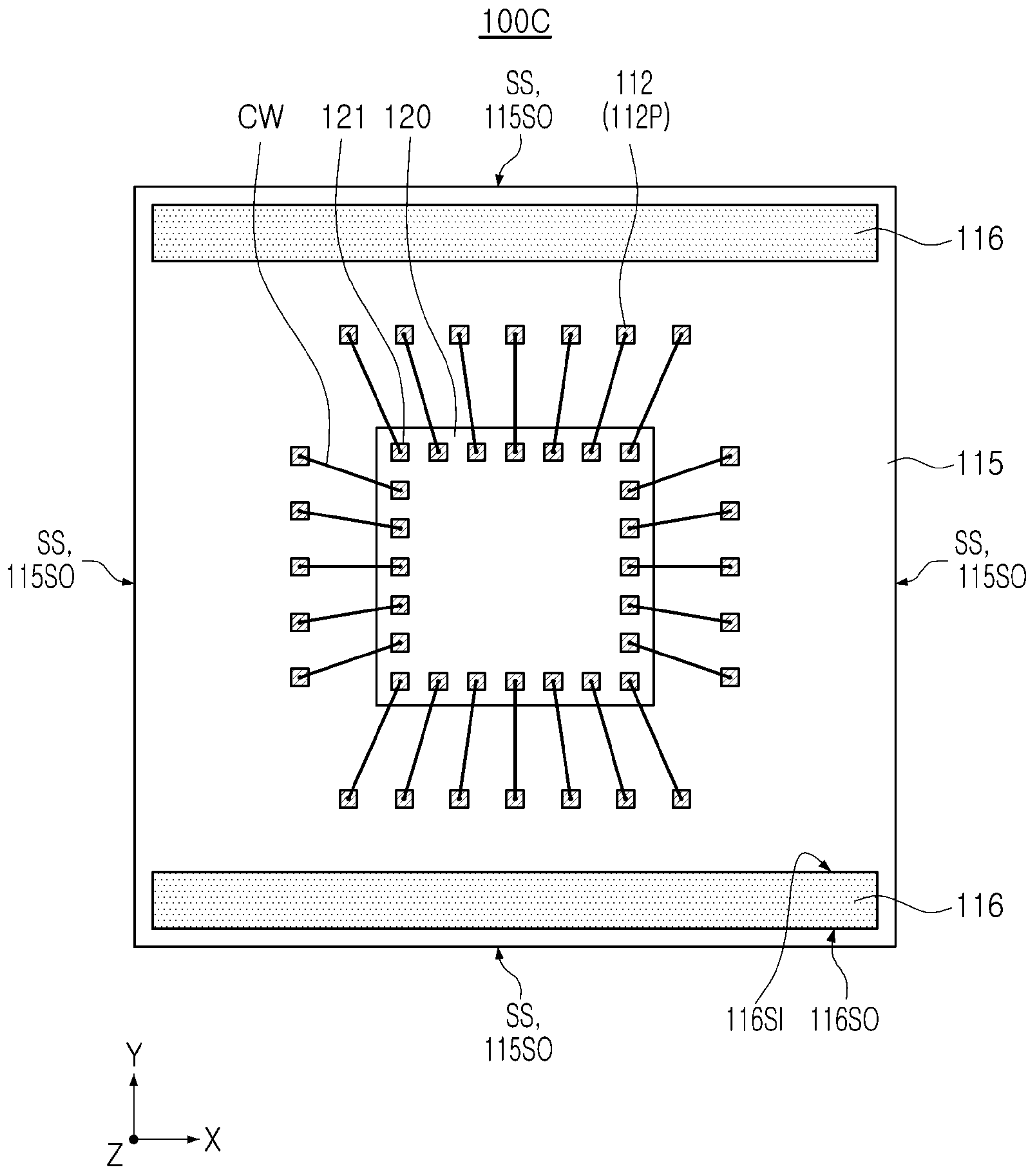
FIG. 3 is a plan view illustrating a semiconductor package according to an example embodiment of the present disclosure.

FIG. 3 is a plan view illustrating a semiconductor package 100C according to an example embodiment of the present disclosure. FIG. 3 illustrates only some components of the semiconductor package 100C corresponding to that illustrated in FIG. 1A.

Referring to FIG. 3, the semiconductor package 100C according to an example embodiment may have features the same as or similar to those described with reference to FIGS. 1A to 2, except that the second upper protective layer 116 is not adjacent to at least one edge SS. In plan view, the second upper protective layer 116 may be disposed to be adjacent to only some of the sides of the substrate 110. For example, the second upper protective layer 116 may be disposed to be adjacent to only two of four sides of the substrate 110. The number and position of the second upper protective layer 116 are not limited to those illustrated in the drawings, and may be properly modified according to warpage properties of the substrate 110.

FIG. 4 is a plan view illustrating a semiconductor package 100D according to an example embodiment of the present disclosure. FIG. 4 illustrates only some components of the semiconductor package 100D corresponding to FIG. 1A.

Referring to FIG. 4, the semiconductor package 100D according to the example embodiment may have features the same as or similar to those described with reference to FIGS. 1A to 3, except that the second upper protective layer 116 has a plurality of inner regions 116H1 and 116H2. The semiconductor package 100D may include a first semiconductor chip 120A and a second semiconductor chip 120B spaced apart from each other, and the second upper protective layer 116 may extend between the first semiconductor chip 120A and the second semiconductor chip 120B. The second upper protective layer 116 may have a first inner region 116H1 in which the first semiconductor chip 120A is disposed and a second inner region 116H2 in which the second semiconductor chip 120B is disposed. The first inner region 116H1 and the second inner region 116H2 may have different sizes depending on corresponding semiconductor chips. In some example embodiments, the second upper protective layer 116 may discontinuously surround the first semiconductor chip 120A and the second semiconductor chip 120B (e.g., as illustrated in the example embodiment of FIG. 2). In this case, the first inner region 116H1 and the second inner region 116H2 may be connected to each other.

FIG. 5 is a cross-sectional view illustrating a semiconductor package 100E according to an example embodiment of the present disclosure. FIG. 5 illustrates only some components of the semiconductor package 100E corresponding to that illustrated in FIG. 1B.

Referring to FIG. 5, the semiconductor package 100E according to an example embodiment may have the same or similar features as those described with reference to FIGS. 1A to 4, except that a plurality of vertically stacked semiconductor chips 120 are included. The semiconductor package 100E may include the first semiconductor chip 120A disposed on the first upper protective layer 115 and the second semiconductor chip 120B disposed on the first semiconductor chip 120A. The first semiconductor chip 120A and the second semiconductor chip 120B may be electrically connected to the wiring layer 112 through the conductive wire CW, respectively. In some example embodiments, the first semiconductor chip 120A and the second semiconductor chip 120B may have the same size (width and area), and may be stacked to be offset (e.g., offset in the X-direction) from each other such that the connection pads 121 disposed on one side thereof are exposed in a vertical direction (Z-direction). The plurality of semiconductor chips may be stacked in a number larger than that illustrated in the drawings.

Figure 6:
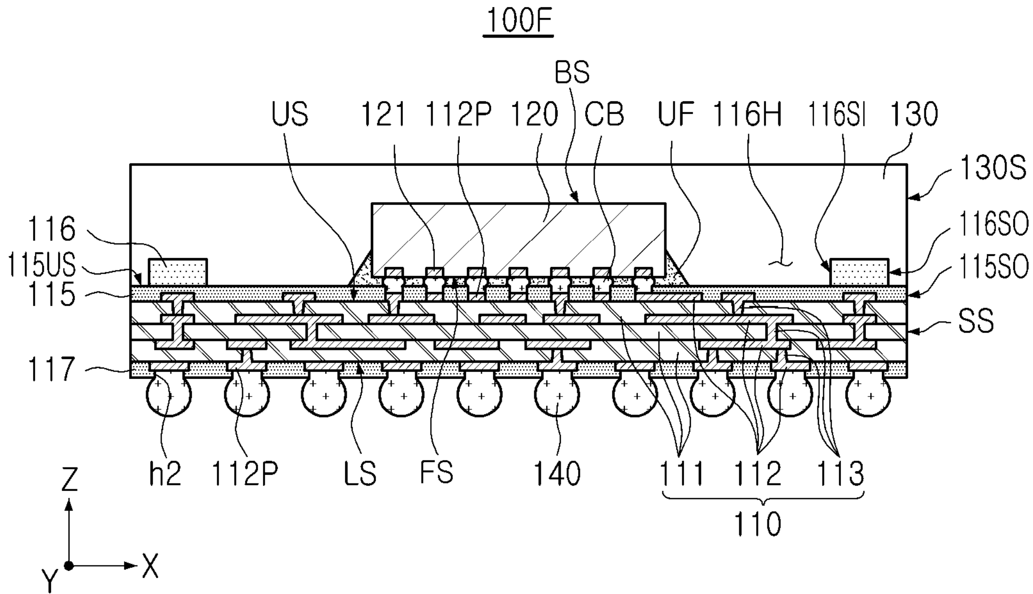
FIG. 6 is a cross-sectional view illustrating a semiconductor package according to an example embodiment of the present disclosure.

FIG. 6 is a cross-sectional view illustrating a semiconductor package 100F according to an example embodiment of the present disclosure. FIG. 6 illustrates only some components of the semiconductor package 100F corresponding to that illustrated in FIG. 1B.

Referring to FIG. 6, the semiconductor package 100F according to the example embodiment may have the same or similar features as those described with reference to FIGS. 1A to 5, except that the semiconductor chip 120 is mounted on the substrate 110 in a flip-chip manner. In the present example embodiment, the semiconductor chip 120 may have a front surface FS facing the upper surface 115US of the first upper protective layer 115, the front surface FS on which the connection pads 121 are disposed, and a rear surface BS positioned opposite to the front surface FS. The connection pads 121 may be connected to the wiring layer 112 through the conductive bumps CB. The conductive bumps CB may include, for example, a solder, but may include both a pillar and a solder in some example embodiments. The pillar may have a cylindrical column shape or a polygonal column shape such as a square or octagonal column. For example, the pillar may include nickel (Ni), copper (Cu), palladium (Pd), platinum (Pt), gold (Au), or combinations thereof. The solder may have a spherical or ball shape. For example, the solder may include tin (Sn), indium (In), bismuth (Bi), antimony (Sb), copper (Cu), silver (Ag), zinc (Zn), lead (Pb) and/or alloys thereof (for example, Sn—Ag—Cu).

In the present embodiment, an underfill resin UF may be disposed below the semiconductor chip 120. The underfill resin UF may have a capillary underfill (CUF) structure, but the present disclosure is not limited thereto. In some example embodiments, the underfill resin UF may have a molded underfill (MUF) structure formed integrally with the encapsulant 130.

Figure 7A:
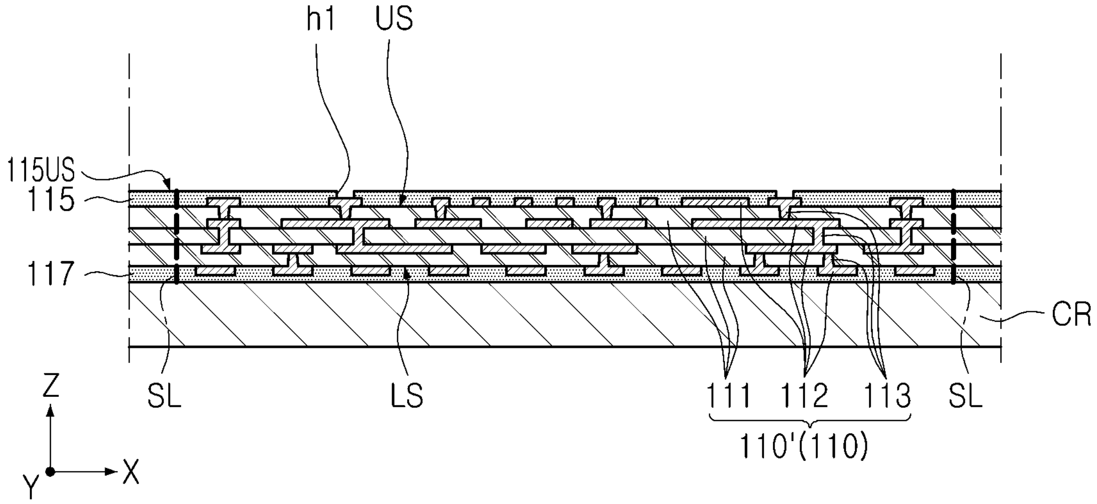
FIG. 7A to 7C are cross-sectional views illustrating a part of a process of manufacturing a semiconductor package according to an example embodiment of the present disclosure.
Figure 7B:
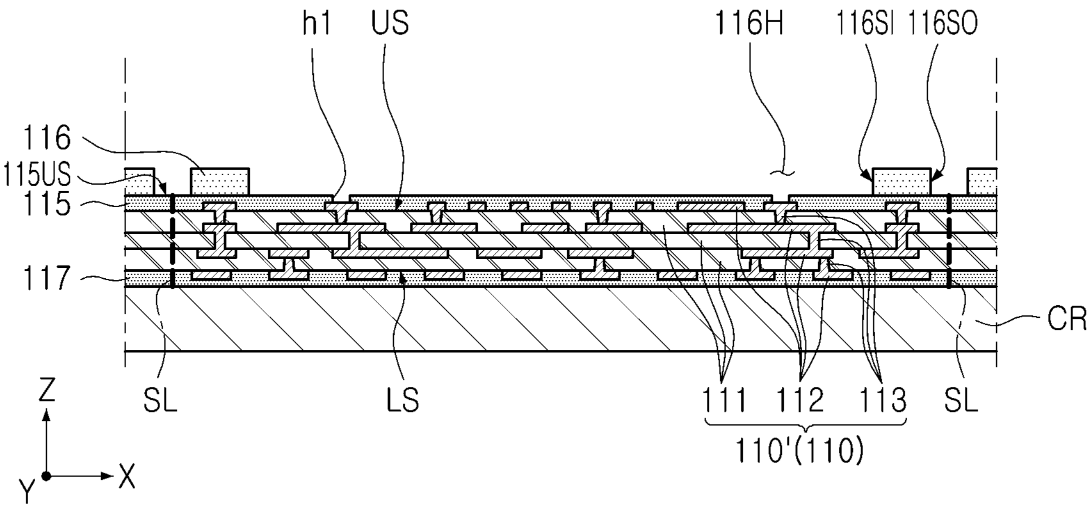
Figure 7C:
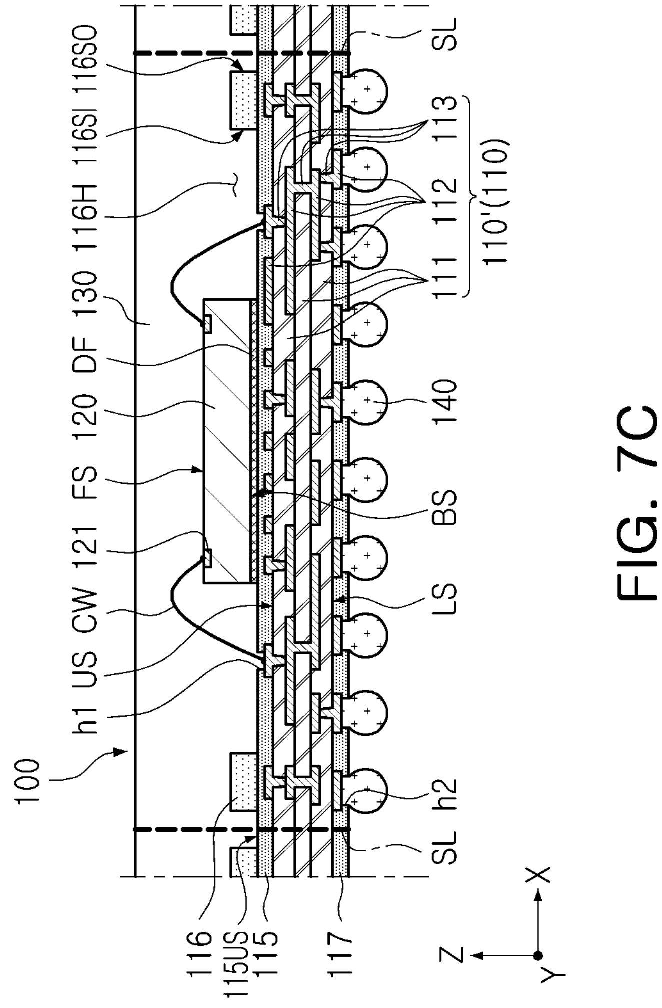

FIGS. 7A to 7C are cross-sectional views illustrating a part of a process of manufacturing the semiconductor package 100 according to an example embodiment of the present disclosure.

Referring to FIG. 7A, first, a preliminary substrate 110' on which the first upper protective layer 115 and the lower protective layer 117 are formed may be prepared.

The preliminary substrate 110' may be temporarily attached to a carrier substrate CR. The preliminary substrate 110' may include components for the plurality of substrates 110 separated by a sawing line SL, for example, the insulating layer 111, the wiring layer 112, and the wiring via 113. The insulating layer 111 may be formed by applying and curing a prepreg or a photosensitive resin. The wiring layer 112 and the wiring via 113 may be formed on the insulating layer 111 using a photolithography process, a plating process, an etching process, or the like.

The first upper protective layer 115 may be formed by applying or attaching a first insulating material (for example, solder resist ink or a film) to the upper surface US of the preliminary substrate 110', and performing an exposure process and a developing process thereon. The first upper protective layer 115 may be formed to have a first opening h1 exposing at least a portion of the wiring layer 112. The lower protective layer 117 may be formed on the lower surface LS of the preliminary substrate 110' by performing a process similar to that of the first upper protective layer 115.

Referring to FIG. 7B, the second upper protective layer 116 may be formed on the first upper protective layer 115.

The second upper protective layer 116 may be formed by applying or attaching a second insulating material (for example, solder resist ink or a film) to the upper surface 115US of the first upper protective layer 115, and performing an exposure process and a developing process thereon. For example, the second upper protective layer 116 may be formed by patterning a solder resist film attached to the upper surface 115US of the first upper protective layer 115. In an example embodiment, the second upper protective layer 116 may be patterned to have the inner region 116H providing a mounting region for a semiconductor chip.

The second insulating material included in the second upper protective layer 116 may have a CTE lower than that of the first insulating material included in the first upper protective layer 115, and may have tensile strength higher than that of the first insulating material. In addition, the second upper protective layer 116 may be disposed to be adjacent to the sawing line SL, thereby improving warpage properties of the preliminary substrate 110' and/or the substrate 110. In addition, the second upper protective layer 116 may be spaced apart from the sawing line SL by a predetermined distance, thereby minimizing the influence of the second upper protective layer 116 on a subsequent process.

Referring to FIG. 7C, the semiconductor chip 120 may be mounted on the preliminary substrate 110', and the encapsulant 130 may be formed.

The semiconductor chip 120 may be disposed in the inner region 116H of the second upper protective layer 116. The semiconductor chip 120 may be disposed on the first upper protective layer 115 such that the front surface FS on which the connection pads 121 are disposed is directed upwards. The semiconductor chip 120 may be attached to the first upper protective layer 115 by the adhesive film DF. Subsequently, the conductive wire CW connecting the connection pads 121 to the wiring layer 112 may be formed. The conductive wire CW may be formed by a wire bonding process using a capillary. The conductive wire CW may include gold (Au), silver (Ag), lead (Pb), aluminum (Al), copper (Cu), or alloys thereof.

The encapsulant 130 may be formed to cover the semiconductor chip 120 and the second upper protective layer 116. The encapsulant 130 may be formed to fill a space between the patterned second upper protective layer 116. For example, the encapsulant 130 may be in contact with both the outer surface 116SO and the inner surface 116SI of the second upper protective layer 116. The encapsulant 130 may be formed by applying and curing an insulating resin such as an EMC. In some example embodiments, a planarization process may be applied to an upper surface of the encapsulant 130. Thereafter, the second opening h2 and the connection bumps 140 are formed on a lower surface of the lower protective layer 117 from which the carrier substrate CR is detached, and individual semiconductor packages 100 may be separated from each other by cutting the encapsulant 130, the first upper protective layer 115, the lower protective layer 117, and the preliminary substrate 110' along the sawing line SL.

While example embodiments have been shown and described above, it will be apparent to those skilled in the art that modifications and variations could be made without departing from the scope of the present disclosure as defined by the appended claims.

What is claimed is:

1. A semiconductor package comprising:

a substrate comprising a lower surface, an opposite upper surface, an insulating layer, and a wiring layer on the insulating layer;

a first upper protective layer on the upper surface of the substrate, the first upper protective layer comprising first openings exposing at least a portion of the wiring layer;

a second upper protective layer on the first upper protective layer;

at least one semiconductor chip on the first upper protective layer, wherein the second upper protective layer extends around, and is spaced apart from an outer periphery of the at least one semiconductor chip, and wherein the at least one semiconductor chip comprises connection pads electrically connected to the wiring layer through the first openings;

an encapsulant on at least a portion of each of the at least one semiconductor chip and the second upper protective layer; and connection bumps on the lower surface of the substrate, the connection bumps electrically connected to the wiring layer, wherein the first upper protective layer comprises a first insulating material, wherein the second upper protective layer comprises a second insulating material having a coefficient of thermal expansion (CTE) lower than a CTE of the first insulating material and a tensile strength higher than a tensile strength of the first insulating material, wherein the CTE of the first insulating material is about 50 ppm/° C. to about 70 ppm/° C., and the CTE of the second insulating material is about 5 ppm/° C. to about 25 ppm/° C., and wherein the tensile strength of the first insulating material is about 40 Mpa to about 60 Mpa, and the tensile strength of the second insulating material is about 90 Mpa to about 110 Mpa.

2. The semiconductor package of claim 1, wherein the CTE of the second insulating material is 0.5 times or less of the CTE of the first insulating material.

3. The semiconductor package of claim 1, wherein the tensile strength of the second insulating material is 1.5 times or more of the tensile strength of the first insulating material.

4. The semiconductor package of claim 1, wherein the first upper protective layer has an upper surface in contact with the second upper protective layer, and the at least one semiconductor chip comprises a rear surface facing the upper surface of the first upper protective layer, and an opposite front surface, wherein the connection pads are on the front surface.

5. The semiconductor package of claim 1, wherein the insulating layer comprises a non-photosensitive resin or a photosensitive resin.

6. The semiconductor package of claim 4, wherein the connection pads of the at least one semiconductor chip are connected to the wiring layer through a conductive wire.

7. The semiconductor package of claim 1, wherein the second upper protective layer is continuous or comprises at least two portions spaced apart from each other.

8. The semiconductor package of claim 7, wherein the at least one semiconductor chip comprises a first semiconductor chip and a second semiconductor chip in adjacent, spaced apart relationship, and the second upper protective layer extends between the first semiconductor chip and the second semiconductor chip.

9. The semiconductor package of claim 1, wherein the first upper protective layer has an upper surface in contact with the second upper protective layer, and the at least one semiconductor chip comprises a front surface facing the upper surface of the first upper protective layer and an opposite rear surface, wherein the connection pads are on the front surface.

10. The semiconductor package of claim 9, wherein the connection pads of the at least one semiconductor chip are connected to the wiring layer through conductive bumps.

11. The semiconductor package of claim 1, wherein the encapsulant covers an inner surface and an outer surface of the second upper protective layer.

12. The semiconductor package of claim 1, further comprising:

a lower protective layer on the lower surface of the substrate, wherein the lower protective layer comprises a second opening exposing at least a portion of the wiring layer.

13. The semiconductor package of claim 12, wherein the lower protective layer comprises a third insulating material having a CTE higher than the CTE of the second insulating material and a tensile strength lower than the tensile strength of the second insulating material.

14. A semiconductor package comprising:

a substrate comprising a lower surface, an opposite upper surface, an insulating layer, and a wiring layer on the insulating layer;

a first upper protective layer on the upper surface of the substrate, the first upper protective layer covering at least a portion of the wiring layer;

a second upper protective layer on the first upper protective layer, wherein an outer surface of the second upper protective layer is spaced apart from an edge of the substrate;

at least one semiconductor chip on the first upper protective layer and spaced apart from the second upper protective layer, wherein the at least one semiconductor chip is electrically connected to the wiring layer; and an encapsulant in a space between the edge of the substrate and the second upper protective layer and in a space between the at least one semiconductor chip and the second upper protective layer, wherein the encapsulant covers an upper surface of the at least one semiconductor chip and an upper surface of the second upper protective layer, wherein the first upper protective layer comprises a first insulating material, wherein the second upper protective layer comprises a second insulating material, wherein a coefficient of thermal expansion (CTE) of the first insulating material is about 50 ppm/° C. to about 70 ppm/° C., and a CTE of the second insulating material is about 5 ppm/° C. to about 25 ppm/° C., and wherein a tensile strength of the first insulating material is about 40 Mpa to about 60 Mpa, and a tensile strength of the second insulating material is about 90 Mpa to about 110 Mpa.

15. The semiconductor package of claim 14, wherein the outer surface of the second upper protective layer is spaced apart from the edge of the substrate by a first distance, and an outer surface of the at least one semiconductor chip is spaced apart from an inner surface of the second upper protective layer by a second distance that is greater than the first distance.

16. The semiconductor package of claim 14, wherein the insulating layer, the first upper protective layer, and the second upper protective layer each comprise respective different insulating materials.

17. A semiconductor package comprising:

a substrate comprising a wiring layer;

a first upper protective layer on the substrate and covering at least a portion of the wiring layer, wherein the first upper protective layer comprises a first outer surface coplanar with an edge of the substrate;

a second upper protective layer on the first upper protective layer and adjacent to at least a portion of the edge of the substrate, wherein the second upper protective layer comprises a second outer surface that is not coplanar with the edge of the substrate;

a lower protective layer below the substrate, the lower protective layer covering at least a portion of the wiring layer;

at least one semiconductor chip on the first upper protective layer and spaced apart from the second upper protective layer, wherein the at least one semiconductor chip is electrically connected to the wiring layer; and an encapsulant on the at least one semiconductor chip and the first upper protective layer, wherein the encapsulant covers an upper surface of the at least one semiconductor chip and an upper surface of the second upper protective layer, wherein the first upper protective layer comprises a first insulating material, wherein the second upper protective layer comprises a second insulating material, wherein a coefficient of thermal expansion (CTE) of the first insulating material is about 50 ppm/° C. to about 70 ppm/° C., and a CTE of the second insulating material is about 5 ppm/° C. to about 25 ppm/° C., and wherein a tensile strength of the first insulating material is about 40 Mpa to about 60 Mpa, and a tensile strength of the second insulating material is about 90 Mpa to about 110 Mpa.

18. The semiconductor package of claim 17, wherein:

an encapsulant on the at least one semiconductor chip and the first upper protective layer, the encapsulant having a side surface coplanar with the first outer surface of the first upper protective layer.

* * * * *